United States Patent
Anderson et al.

(10) Patent No.: US 7,460,165 B2
(45) Date of Patent: Dec. 2, 2008

(54) PHOTO-ARRAY LAYOUT FOR MONITORING IMAGE STATISTICS

(75) Inventors: Mark A. Anderson, Fort Collins, CO (US); Robert Elsheimer, Fort Collins, CO (US)

(73) Assignee: Aptina Imaging Corporation, Grand Cayman (KY)

( * ) Notice: Subject to any disclaimer, the term of this patent is extended or adjusted under 35 U.S.C. 154(b) by 741 days.

(21) Appl. No.: 10/754,434

(22) Filed: Jan. 9, 2004

(65) Prior Publication Data

US 2005/0151864 A1    Jul. 14, 2005

(51) Int. Cl.
*H04N 3/14*    (2006.01)
*H04N 5/335*    (2006.01)

(52) U.S. Cl. ................................ 348/308; 348/302

(58) Field of Classification Search ................ 348/294, 348/308, 258; 250/208.1
See application file for complete search history.

(56) References Cited

U.S. PATENT DOCUMENTS

| | | | |
|---|---|---|---|
| 5,937,027 A * | 8/1999 | Thevenin et al. ........... 378/98.8 |
| 6,097,851 A | 8/2000 | Anderson | |
| 6,233,368 B1 | 5/2001 | Badyal et al. | |
| 6,373,994 B1 | 4/2002 | Anderson | |
| 6,466,265 B1 * | 10/2002 | Lee et al. .................... 348/308 |
| 6,568,777 B1 | 5/2003 | Anderson et al. | |
| 6,631,218 B2 | 10/2003 | Badyal et al. | |
| 7,071,984 B2 * | 7/2006 | Kawakami ................... 348/315 |
| 7,088,395 B2 * | 8/2006 | Takayama et al. ........... 348/297 |
| 7,158,182 B2 * | 1/2007 | Watanabe et al. ........... 348/345 |
| 2003/0011693 A1 * | 1/2003 | Oda ........................... 348/272 |

\* cited by examiner

*Primary Examiner*—Ngoc-Yen Vu
*Assistant Examiner*—Christopher K Peterson
(74) *Attorney, Agent, or Firm*—Ratner Prestia

(57) ABSTRACT

An imaging apparatus including a photo sensor array having an array of sensors is disclosed, each sensor having an active area and a support hardware area adjoining the active area. In the prior art, the support hardware area of each sensor adjoins the active area of the sensor in the same direction. In the present invention, a sensor array has an array of sensors where, for each sensor, the support hardware area adjoins the active area of the sensor in a direction that is radially away from center of the sensor array whereby at least one freed area is defined within the sensor array. One or more reference detectors can be fabricated in the freed areas. This design allows the imaging apparatus to gather better image statistics, overcome shortcomings of the prior art design, or both.

20 Claims, 4 Drawing Sheets

PHOTO-ARRAY LAYOUT FOR MONITORING IMAGE STATISTICS

BACKGROUND

The present invention relates to digital imaging systems. More particularly, the present invention relates to the art of detecting image statistics.

In digital imaging devices such as digital cameras, a scene is captured by using a lens to direct light from the scene on an array of sensors, or photo-detectors, such as an array of photodiodes. Each sensor of the sensor array detects light from a tiny portion of the scene. At each sensor, the detected light is converted into an electrical signal, and then into a digital value indicating the intensity of the light detected by that sensor. Then, the digital values from all of the sensors of the sensor array are combined to form an image of the scene. For this reason, the sensor array is referred to as the image sensor array.

FIG. 1 illustrates a single sensor 10 including an active area 12 and a support hardware area 14. As illustrated, the active area 12 can be fabricated generally in the shape of a cross and the support hardware area 14 generally having a rectangular shape and adjoining the active area 12. The active area 12 includes a photo-detector to capture light to produce a corresponding electrical signal. The electrical signal is processed by support hardware in the support hardware area 14. The support hardware can include, for example, amplifiers, buffers, and converters. Light falling on the support hardware area 14 portion of the sensor 10 is lost as there are no photo-detectors in that area. For this reason, the support hardware area 15 is designed to occupy smallest area possible and covers smaller area than the area occupied by its active area 12. Additionally, the support hardware area 14 adjoins the active area 12 at a predetermined direction 17 relative to the active area 12. In the illustrated sensor 10, the support hardware area 14 adjoins the active area 12 at upper right direction relative to the active area 12.

Sizes of the sensor 10 and its component areas can vary greatly depending on the materials for the sensor 10, processes used to fabricate the sensor 10, and the desired application. For the sample sensor 10 of FIG. 1, the active area 10 can have a lateral extent 13 in the order of microns or tens of microns, for example, approximately 60 microns. The hardware support area 14 of the sensor 10 can have a lateral extent 15 in the order of microns or tens of microns, for example, approximately 20 microns.

Popular image sensor arrays include CMOS (complementary metal-oxide semiconductor) sensors and CCDs (charge-coupled devices) sensors. An image sensor array often includes a rectangular layout of many hundreds of thousands, millions, or even greater number of sensors, each sensor providing a digital value, or a pixel, of information. For example, a rectangular image sensor array arranged in 640 columns and 480 rows has 307,200 sensors, or pixels. A digital value from a sensor is defined as a pixel of the image. For convenience, terms "sensor" and "pixel" are herein used interchangeably unless otherwise noted, and each sensor, or pixel, is referred generically as $P_{i,j}$ where i,j indicates that the pixel is located at $i^{th}$ column at $j^{th}$ row of a rectangular image sensor array having M columns and N rows, the value of i ranging from 1 to M, inclusive, and the value of j ranging from 1 to N, inclusive.

FIG. 2 illustrates a sample sensor array 20 including a rectangular array of sensors, each sensor having the configuration of the sensor 10 of FIG. 1. For simplicity, the sensor array 20 includes 36 sensors in a six by six rectangular configuration. Each sensor of the sensor array 20 having a cross shaped active area (for example, active area 22) adjoining a support hardware area (for example, support hardware area 24) to its upper right direction 26.

To capture a scene, each of the sensors of the image sensor array is initialized to an initial value. Then, the image sensor array is exposed to light from the scene for a period of time, the exposure period. After the exposure, the values of the sensors are read. The values from the sensors are combined to form an image of the scene. For best results, it is desirable to know various characteristics or statistics of the light from the scene to determine the operations of the image sensor array. For example, it is desirable to know the intensity of the light from the scene to determine the exposure period. For convenience, the characteristics or statistics of the light from the scene is referred to as "image statistics" in this document. For example, image statistics may include average pixel value.

Various approaches have been taken to gather image statistics during the image capture process. In a first approach a digital imaging device includes a reference detector positioned proximal to its image sensor array. Further, the reference detector is provided with its own lens and optical path through which light from the scene enters. In this design, the reference detector is operated substantially simultaneously as the image sensor array to collect image statistics. The reference detector can be a single detector or an array of detectors. Here, the cost, the complexity, and the bulk of the digital imaging device are increased and the reliability is decreased. This is because the reference detector needs its own lens and optical path, introducing additional components to the digital imaging device. Further, the image exposed to the reference detector is not identical to the image exposed to the image sensor array. Accordingly, the image statistics gather from the reference detector may only be marginally applicable to the image captured by the image sensor array, or the image statistics gather from the reference detector may not be applicable or even useful at all.

In a second approach, a beam splitter is used to split the light from a scene such that a first portion of the light from the scene is directed toward the image sensor array while a second portion of the light from the scene is directed toward a reference detector. Simultaneously, the reference detector senses the second portion of the light to gather images statistics. The image statistics can be used to determine the exposure period of the image sensor array or various processing parameters for processing of the captured image. Here, both the image sensor array and the reference detector see the identical scene. However, some of the light (the second portion) from the scene is lost to the image sensor because it is directed toward the reference detector.

In a third approach, the image sensor array is exposed (to the scene to be captured) twice in succession. During the first exposure, image statistics are gathered using the image sensor array. During the second exposure, the scene is captured as an image. In this design, no additional components are required, and the light from the scene is not apportioned. However, this approach requires two exposures of the image sensor array. Moreover, the lighting condition may have changed from the first exposure to the second exposure.

In a fourth approach, one or more sensors at the edges of the image sensor array are used as the reference detector to gather image statistics. Here, no additional components are required, and the light from the scene is not apportioned. However, the image statistics do not reflect the characteristics of the image near its center which is often the most interesting part of the image.

Accordingly, there remains a need for an improved digital imaging system for monitoring image statistics.

SUMMARY

The need is met by the present invention. In a first embodiment of the present invention, a photo sensor array includes an array of sensors, an array of sensors, each sensor of the sensor array having an active area adapted to detect light and a support hardware area adjoining the active area. The support hardware area of each sensor adjoins the active area of the sensor in a direction that is radially away from center of the sensor array whereby at least one freed area is defined within the sensor array.

In a second embodiment of the present invention, a photo sensor array includes an array of sensors and a reference detector. Each sensor of the sensor array has an active area adapted to detect light and a support hardware area connected to the active area. The reference detector is located between a first sensor and a second sensor of the sensor array where the first sensor has a first active area adapted to detect light and a first support hardware area is connected to the first active area, the first support hardware area connected to the first active area in a first direction radially away from the reference detector. Further, the second sensor has a second active area adapted to detect light and a second support hardware area connected to the second active area, the second support hardware area is connected to the second active area in a second direction radially away from the reference detector.

In a third embodiment of the present invention, an image capture apparatus includes a lens adapted to focus a scene onto an image sensor array. The photo sensor array includes an array of sensors, an array of sensors, each sensor of the sensor array having an active area adapted to detect light and a support hardware area adjoining the active area. The support hardware area of each sensor adjoins the active area of the sensor in a direction that is radially away from center of the sensor array whereby at least one freed area is defined within the sensor array.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the FIGS. 1 through 5, which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "above" or "right of" relative to other structures, portions, or both. As will be appreciated by those of skill in the art, relative terms and phrases such as "above" or "right of" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "above" or "right of" other structures or portions would now be oriented "below" or "left of" the other structures or portions. Like numbers refer to like elements throughout.

As shown in the figures for the purposes of illustration, embodiments of the present invention are exemplified by an array of sensors, each sensor of the sensor array having an active area adapted to detect light and a support hardware area adjoining the active area in a predetermined direction. In the prior art, the support hardware area of each sensor adjoins the active area of the sensor in the same direction. In one embodiment of the sensor array of the present invention, the support hardware area of each sensor adjoins the active area of the sensor in a direction that is radially away from center of the sensor array whereby at least one freed area is defined within the sensor array.

A reference detector can be fabricated within the freed area to gather the image statistics. An imaging apparatus having a sensor array embodying the present design has a number of advantages over the prior art. Firstly, the reference detector is built within the image sensor array; therefore, a separate reference detector and its own optics components are not needed. Secondly, reference detector is exposed (to light from the scene to be captured) at the same time as the image sensor array; therefore, only one exposure to the scene is need. Thirdly, the reference detector is exposed to the same scene as the scene exposed to the rest of the image sensor array; therefore, image statistics gathered using the reference detector is applicable. Finally, the reference detector can be used to gather image statistics from the center or other useful or interesting portions of the image sensor array; therefore, image statistics is gathered at the most interesting portions of the imaging sensor array.

Figure 3:
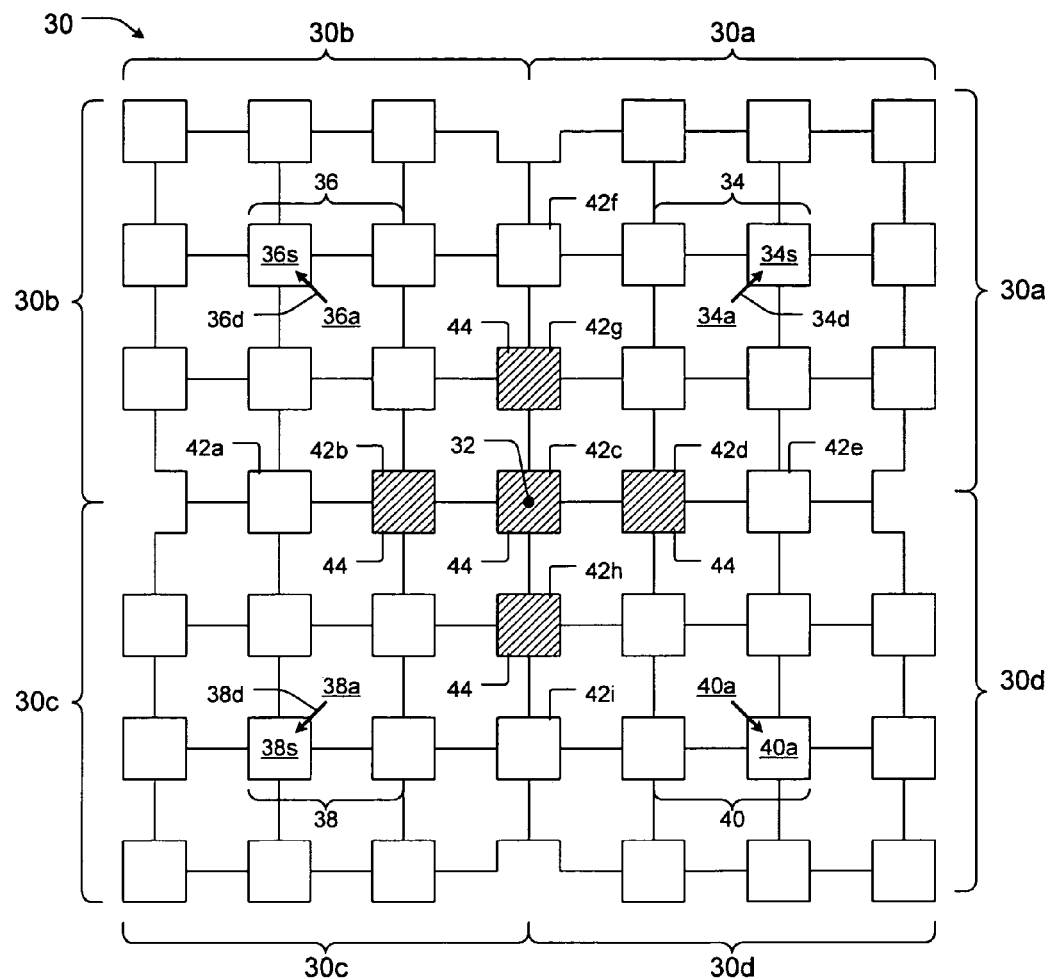
FIG. 3 illustrates a photo-sensor array according to one embodiment of the present invention.

FIG. 3 illustrates a first embodiment of the present invention as a photo-sensor array 30, for example a CMOS sensor array. The sensor array 30 as illustrated, for simplicity, as a rectangular grid of six by six sensors. However, in actual implementation, the sensor array 30 can have hundreds, thousands, or even more sensors per each row, column, or both. Each sensor of the sensor array 30 has an active area and an adjoining support hardware area and is configured similar to the sensor 10 of FIG. 1. However, here, the support hardware area of each sensor adjoins the active area of the sensor in a direction that is radially away from center of the sensor array 30 whereby at least one freed area is defined within said sensor array.

The sensor array 30 (a physical object occupying a definable space) defines a center of its sensing area. In FIG. 3, the center is illustrated as a point 32. Here, for each of the sensors, the support hardware area sensor adjoins the active area of the sensor in a direction that is radially away from the center 32 of the sensor array 30. The direction, for each sensor, in which the support hardware area adjoins the active area depends on the sensor's location relative to the desired location of the freed area. In the illustrated example, the desired location of the freed area is the center 32 of the sensor array 30. Accordingly, the direction, for each sensor, in which the support hardware area adjoins the active area depends on which quadrant of the sensor array 30 within which the sensor is located.

For example, for a first sensor 34 (located within the first quadrant 30a), its hardware support area 34s adjoins its active area 34a in a direction 34d (indicated by an arrow 34d) that is radially away from the center 32 of the sensor array 30. For a second sensor 36 (located within the first quadrant 30a), its hardware support area 36s adjoins its active area 36a in a direction 36d (indicated by an arrow 36d) that is radially away from the center 32 of the sensor array 30. For a third sensor 38 (located within the first quadrant 30a), its hardware support area 38s adjoins its active area 38a in a direction 38d (indicated by an arrow 38d) that is radially away from the center 32 of the sensor array 30. For a fourth sensor 40 (located within the first quadrant 30a), its hardware support area 40s adjoins its active area 40a in a direction 40d (indicated by an arrow 40d) that is radially away from the center 32 of the sensor array 30.

Figure 1:
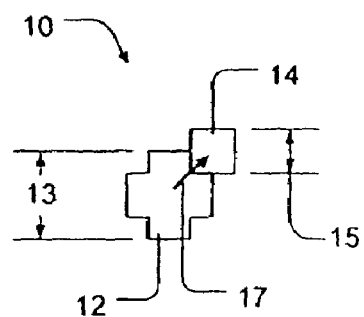
FIG. 1 illustrates a sample photo-sensor.
Figure 2:
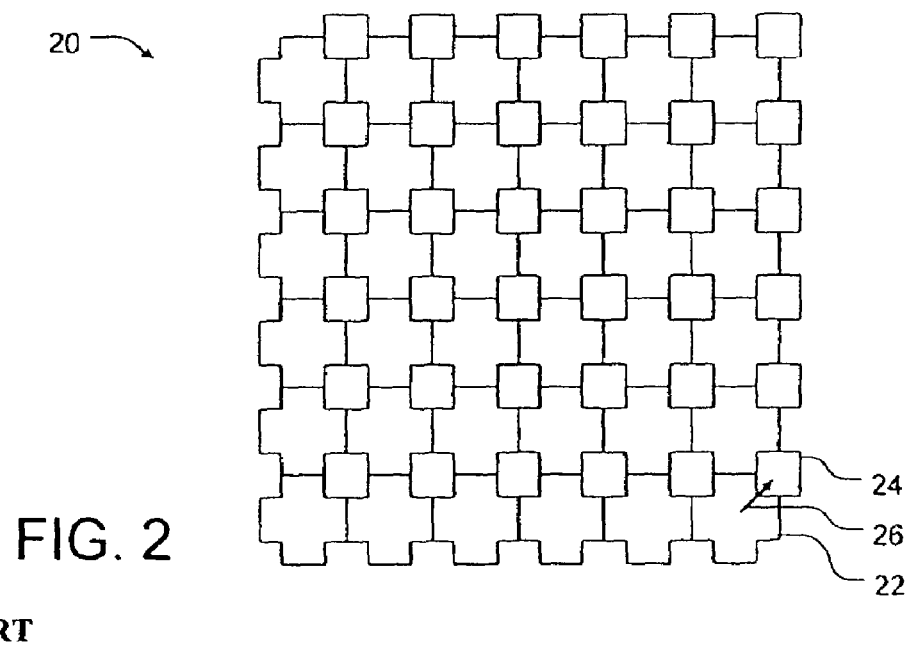
FIG. 2 illustrates a sample photo-sensor array including an array of photo-sensors of FIG. 1.

This design results in freed areas 42a, 42b, 42c, 42d, 42e, 42f, 42g, 42h, and 42i (collectively, these freed areas is referred as the freed areas 42). The freed areas are areas which were used as support hardware areas in the prior art designs as illustrated in FIG. 2. By positioning, for each sensor of the sensor array, the support hardware area radially away from the center 32, the freed areas 42 become unoccupied and the sensors define a plurality of freed areas within the sensor array 30.

During the process of fabricating the sensor array 30, a reference detector can be fabricated in one or more freed areas 42. In the illustrated embodiment of FIG. 3, a reference detector 44 is built in and occupies the freed areas 42b, 42c, 42d, 42g, and 42h. The reference detector 44 can be a photo-detector and have same or similar circuits as the active areas of the sensors of the sensor array 30. The photo-detectors occupying these freed areas (42b, 42c, 42d, 42g, and 42h) can be electrically connected to form a single reference detector 44. The electrical connection is not illustrated in the Figures can be accomplished in layers under or over the sensor array 30 depending on embodiment.

As illustrated, the reference detector 44 can be positioned substantially at the center 32 of the sensor array 30. The reference detector 44 is positioned between the first sensor 34 and the second sensor 36 as well as between the third sensor 38 and a fourth sensor 40. As already discussed, each of these sensors 34, 36, 38, and 40 has a support hardware area connected to its active area adjoining its active area in a direction radially away from the reference detector 44. Not all freed areas need be used for a reference detector. In fact, some freed areas (42a, 42e, 42f, and 42i) are not used for the reference detector.

Figure 4:
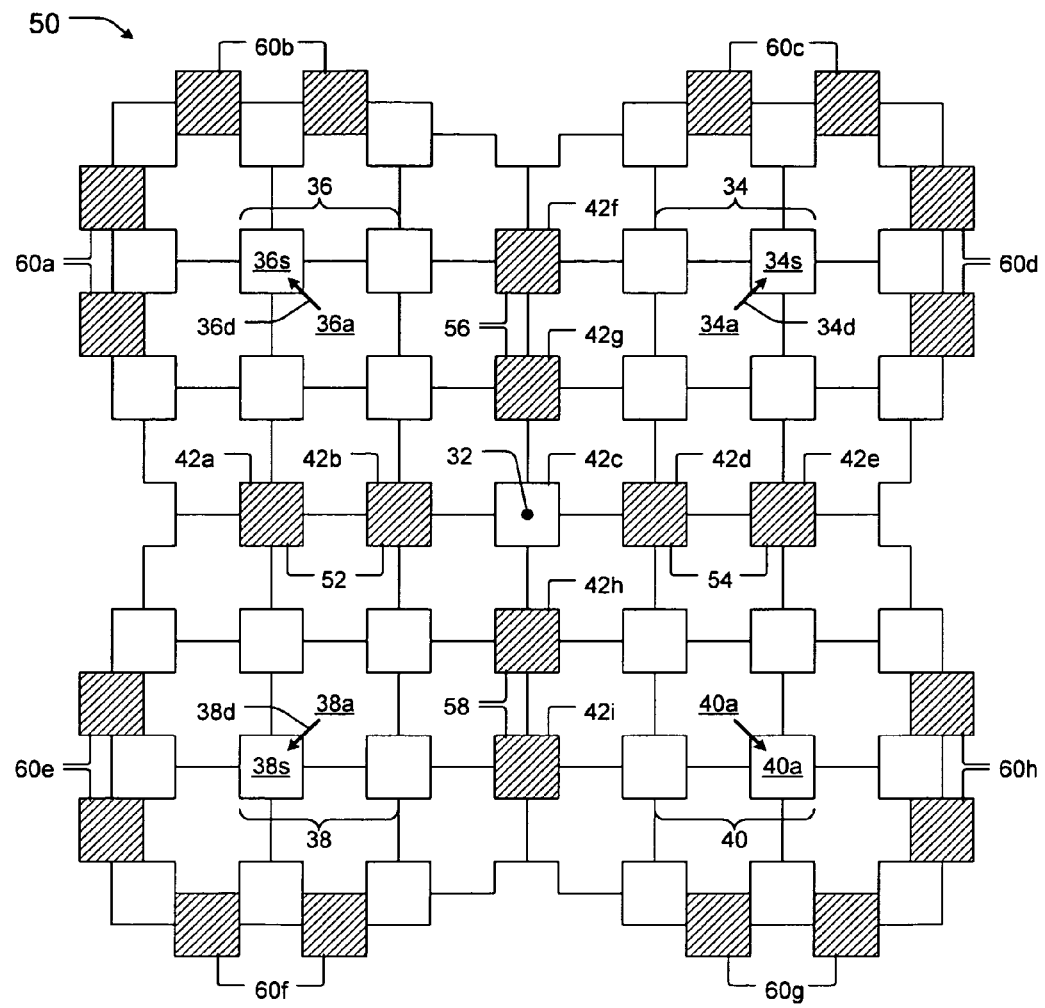
FIG. 4 illustrates a photo-sensor array according to another embodiment of the present invention.

An embodiment of the invention having certain alternate configuration is shown in FIG. 4. Portions of this embodiment are similar to corresponding portions shown in FIG. 3. For convenience, portions in FIG. 4 that are similar to corresponding portions in FIG. 3 are assigned the same reference numerals and different components are assigned different reference numerals.

Referring to FIG. 4, a sensor array 50 includes a plurality of reference detectors, some reference detector occupying a subset of freed areas. As with the sensor array 30 of FIG. 3, the sensor array 50 defines freed areas 42a, 42b, 42c, 42d, 42e, 42f, 42g, 42h, and 42i (collectively, "freed areas 42"). Here, a first reference detector 52 occupies freed areas 42a and 42b. These freed areas 42a and 42b can be fabricated having photo-detector circuits and electrically connected to form the first reference detector 52. These freed areas 42a and 42b form a subset of the freed areas 42 available due to the inventive design layout of the present invention discussed above. Likewise a second reference detector 54 occupies freed areas 42d and 42e, a third reference detector 56 occupies freed areas 42f and 42g, and a fourth reference detector 58 occupies freed areas 42h and 42i. In addition to the reference detectors occupying the freed areas, the sensor array 50 can include one or more edge reference detectors along the edges of the sensor array 50. For example, for the sensor array 60, eight edge detectors 60a, 60b, 60c, 60d, 60e, 60f, 60g, and 60i are illustrated, each edge detector occupying edge areas electrically connected. In alternative embodiments, the multiple edge areas can be connected to form a single edge reference detector to gather image statistics. In another alternative embodiment, each of the edge areas can be operated as an individual reference detector to gather image statistics.

Figure 5:
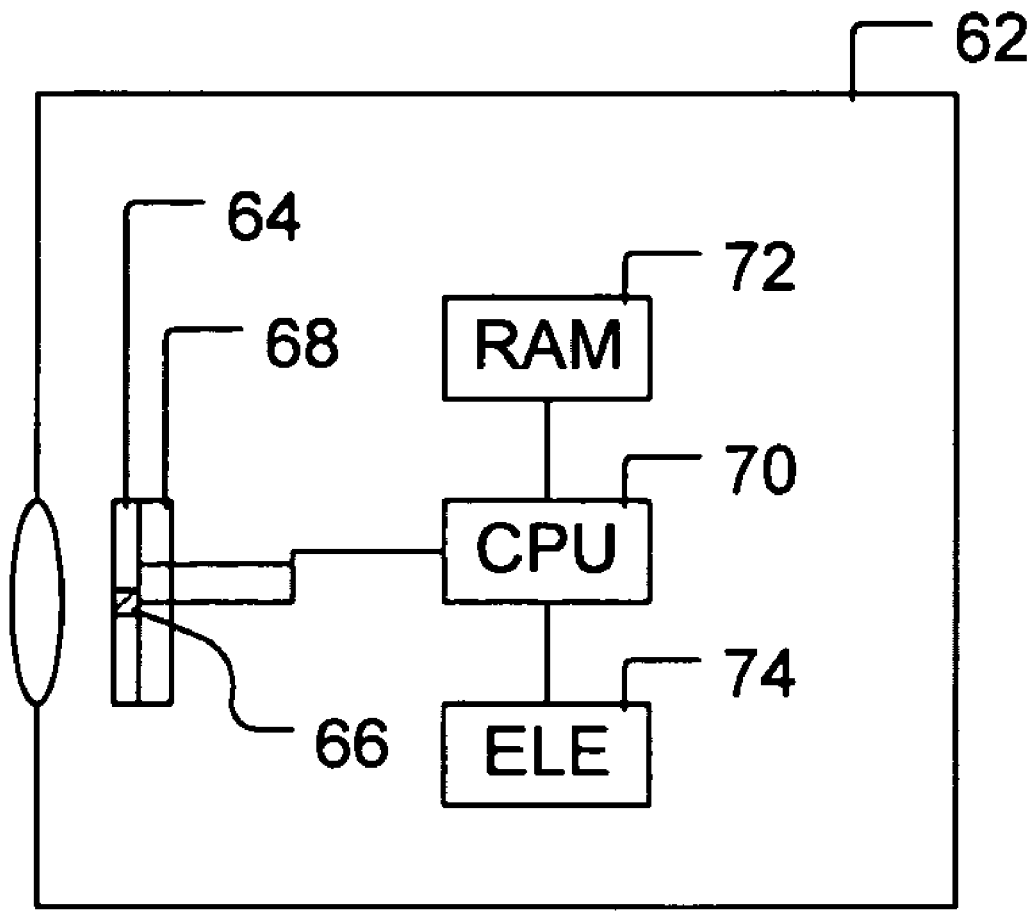
FIG. 5 illustrates an image capture apparatus according to one embodiment of the present invention.

FIG. 5 illustrates a simplified schematic diagram of an image capture apparatus 62 such as, for example, a digital camera, personal digital assistant (PDA), or a mobile communication device such as a cellular camera. The apparatus 62 has a lens that directs or focuses a scene to be captured onto an image sensor array 64, the image sensor array 64 including a reference detector 66. The image sensor array 64 can be configured as the image sensor array 30 of FIG. 3 or the image sensor array 50 of FIG. 4. The sensor array 64 is typically fabricated on a substrate 68 such as silicon substrate 68. The image sensor array 64 is connected to a processor 70 that processes data from the image sensor array 64. The processor can be connected to storage 72 and other electronic circuits 74 to implement other functions of the apparatus 62.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A photo sensor array comprising:
   a plurality of sensors, each sensor including:
      an active area portion adapted to detect light and having a cross shape and a first surface area; and
      a support hardware area portion having a rectangular shape and a second surface area that is smaller than the first surface area; and
   a reference sensor;
   wherein,
      the plurality of sensors are separated into:
         a first set of sensors sized and arranged such that:
            the support hardware area portion of each sensor of the first set adjoins the active area portion of the sensor along a first concavity of the cross shape; and
            the first set of sensors tile a first region of the photo sensor array so that the active area portions of the sensors of the first set are aligned to a regular rectangular grid; and
         a second set of sensors sized and arranged such that:
            the support hardware area portion of each sensor of the second set adjoins the active area portion of the sensor along a second concavity of the cross shape;
            the second set of sensors tile a second region of the photo sensor array so that the active area portions of the sensors of the second set are aligned to the regular rectangular grid;
      the second region of the photo sensor array adjoins the first region of the photo sensor array such that at least one freed area that does not include the support hardware area portion of any sensor of the first set or the support hardware area portion of any sensor of the second set is formed between the first region and the second region of the photo sensor array, each freed area having the rectangular shape and the second surface area; and the reference sensor is formed in the at least one freed area.

2. The photo sensor array recited in claim 1 wherein the reference detector is positioned substantially at the center of the sensor array.

3. The photo sensor array recited in claim 1 wherein a plurality of freed areas are formed between the first region and the second region of the photo sensor array.

4. The photo sensor array recited in claim 3 further comprising a plurality of reference detectors, at least one reference detector occupying a subset of the freed areas.

5. The photo sensor array recited in claim 1 wherein the sensor array is a CMOS circuit.

6. The photo sensor array recited in claim 1 further comprising at least one edge reference detector.

7. The image capture apparatus recited in claim 1 wherein the support hardware area portion includes at least one amplifier, buffer, or converter.

8. The photo sensor array recited in claim 1 wherein the reference sensor includes an active reference area portion adapted to detect light and a reference support hardware area portion.

9. The photo sensor array recited in claim 8 wherein the active reference area portion of the reference sensor has a reference surface area approximately equal to the first surface area of the active area portion of one of the plurality of sensors.

10. The photo sensor array recited in claim 1 wherein the reference sensor senses light to determine image statistics.

11. The photo sensor array recited in claim 1 wherein:
the first set of sensors includes M×N sensors arranged in M rows of sensors and N columns of sensors, where N and N are positive integers; and
the second set of sensors includes N×N sensors arranged in M rows of sensors and N columns of sensors.

12. The photo sensor array recited in claim 11 wherein:
the rows of sensors of the first set of sensors are numbered 1 to M;
the rows of sensors of the second set of sensors are numbered 1 to M;
row M of sensors of the first set of sensors adjoins row 1 of sensors of the second set of sensors; and
the photo sensor array has 2×M rows of sensors and N columns of sensors.

13. The photo sensor array recited in claim 1 wherein:
the at least one freed area is a plurality of freed areas; and
at least one other reference sensor is formed in the plurality of freed areas.

14. An image capture apparatus comprising:
a lens adapted to focus a scene onto an image sensor array;
wherein:
the image sensor array comprises:
a plurality of sensors, each sensor including:
an active area portion adapted to detect light and having a cross shape and a first surface area; and
a support hardware area portion having a rectangular shape and a second surface area that is smaller than the first surface area; and
a reference sensor;
the plurality of sensors are separated into:

a first set of sensors sized and arranged such that:
the support hardware area portion of each sensor of the first set adjoins the active area portion of the sensor along a first concavity of the cross shape; and
the first set of sensors tile a first region of the image sensor array so that the active area portions of the sensors of the first set are aligned to a regular rectangular grid;
a second set of sensors sized and arranged such that:
the support hardware area portion of each sensor of the second set adjoins the active area portion of the sensor along a second concavity of the cross shape;
the second set of sensors tile a second region of the image sensor array so that the active area portions of the sensors of the second set are aligned to the regular rectangular grid;
the second region of the image sensor array adjoins the first region of the image sensor array such that at least one freed area that does not include the support hardware area portion of any sensor of the first set or the support hardware area portion of any sensor of the second set is formed between the first region and the second region of the image sensor array, each freed area having the rectangular shape and the second surface area; and
the reference sensor is formed in the at least one freed area.

15. The image capture apparatus recited in claim 14 wherein the reference detector is positioned substantially at the center of the image sensor array.

16. The image capture apparatus recited in claim 14 wherein a plurality of freed areas are formed between the first region and the second region of the image sensor array.

17. The image capture apparatus recited in claim 14 further comprising at least one edge reference detector.

18. A photo sensor array comprising:
a plurality of sensors, each sensor including:
an active area portion adapted to detect light and having a cross shape and a first surface area; and
a support hardware area portion having a rectangular shape and a second surface area that is smaller than the first surface area; and
a reference sensor;
wherein,
the plurality of sensors are separated into four sets of sensors, including:
a first set of sensors sized and arranged such that:
the support hardware area portion of each sensor of the first set adjoins the active area portion of the sensor along a first concavity of the cross shape; and
the first set of sensors tile a first region of the photo sensor array so that the active area portions of the sensors of the first set are aligned to a regular rectangular grid;
a second set of sensors sized and arranged such that:
the support hardware area portion of each sensor of the second set adjoins the active area portion of the sensor along a second concavity of the cross shape;
the second set of sensors tile a second region of the photo sensor array so that the active area portions of the sensors of the second set are aligned to the regular rectangular grid;
a third set of sensors sized and arranged such that:

the support hardware area portion of each sensor of the third set adjoins the active area portion of the sensor along a third concavity of the cross shape;

the third set of sensors tile a third region of the photo sensor array so that the active area portions of the sensors of the third set are aligned to the regular rectangular grid; and a fourth set of sensors sized and arranged such that:

the support hardware area portion of each sensor of the fourth set adjoins the active area portion of the sensor along a fourth concavity of the cross shape;

the fourth set of sensors tile a fourth region of the photo sensor array so that the active area portions of the sensors of the fourth set are aligned to the regular rectangular grid;

the first region of the photo sensor array adjoins the second region and the third region of the photo sensor array, the second region of the photo sensor array adjoins the first region and the fourth region of the photo sensor array, the third region of the photo sensor array adjoins the first region and the fourth region of the photo sensor array, and the fourth region of the photo sensor array adjoins the second region and the third region of the photo sensor array;

the plurality of sensors are arranged such that at least one freed area is formed within the photo sensor array;

the at least one freed area does not include:

the support hardware area portion of any sensor of the first set;

the support hardware area portion of any sensor of the second set;

the support hardware area portion of any sensor of the third set; or the support hardware area portion of any sensor of the fourth set;

each freed area has the rectangular shape and the second surface area and adjoins four sensors of the plurality of sensors, the four sensors adjoining each freed area include:

at least one sensor from one set of the four sets of sensors; and at least one sensor from another set of the four sets of sensors; and the reference sensor is formed in the at least one freed area.

19. The photo sensor array recited in claim 18 wherein each of the four sets of sensors includes M×N sensors arranged in M rows of sensors and N columns of sensors, where M and N are positive integers.

20. The photo sensor array recited in claim 18 wherein: the rows of sensors of each of the four sets of sensors are numbered 1 to M; the columns of sensors of each of the four sets of sensors are numbered 1 to N; column N of sensors of the first set of sensors adjoins column 1 of sensors of the second set of sensors; row M of sensors of the first set of sensors adjoins row 1 of sensors of the third set of sensors; row M of sensors of the second set of sensors adjoins row 1 of sensors of the fourth set of sensors; column N of sensors of the third set of sensors adjoins column 1 of sensors of the fourth set of sensors; and the photo sensor array has 2×M rows of sensors and 2×N columns of sensors.

* * * * *